US 8,043,521 B2

(12) United States Patent
Gale

(10) Patent No.: US 8,043,521 B2
(45) Date of Patent: Oct. 25, 2011

(54) PROCESSING APPARATUS

(75) Inventor: Glenn Gale, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 8 days.

(21) Appl. No.: 12/230,943

(22) Filed: Sep. 8, 2008

(65) Prior Publication Data

US 2009/0011523 A1 Jan. 8, 2009

Related U.S. Application Data

(62) Division of application No. 11/252,212, filed on Oct. 18, 2005, now abandoned.

(30) Foreign Application Priority Data

Oct. 19, 2004 (JP) .................................. 2004-304471

(51) Int. Cl.
*H01L 21/308* (2006.01)
(52) U.S. Cl. .............. 216/95; 134/1.3; 134/113; 134/36
(58) Field of Classification Search .................. 134/1.3, 134/113, 36; 156/345.15, 345.24; 216/84, 216/95
See application file for complete search history.

(56) References Cited

U.S. PATENT DOCUMENTS

| 6,178,975 | B1 * | 1/2001 | Aoki ............................ 134/57 R |
| 6,326,313 | B1 * | 12/2001 | Couteau et al. ............... 438/745 |
| 6,510,859 | B1 | 1/2003 | Kamikawa |
| 6,653,206 | B2 * | 11/2003 | Yanagita et al. ............... 438/458 |
| 6,686,239 | B2 * | 2/2004 | Nam et al. .................... 438/244 |
| 6,979,655 | B2 * | 12/2005 | Niuya et al. .................. 438/745 |
| 2002/0155709 | A1 | 10/2002 | Toshima et al. |
| 2006/0060232 | A1 | 3/2006 | Tsurusaki et al. |
| 2006/0088959 | A1 | 4/2006 | Gale |
| 2006/0163205 | A1 | 7/2006 | Niuya et al. |
| 2009/0011523 | A1 * | 1/2009 | Gale .................................. 438/5 |

FOREIGN PATENT DOCUMENTS

| JP | 09-143761 | 6/1997 |
| JP | 2004-179583 | 6/2004 |
| JP | 2004179583 A * | 6/2004 |

OTHER PUBLICATIONS

Machine Generated English Translation of JP 2004-179583, published Jun. 24, 2004.*
Japanese Office Action; Japanese patent Application No. 2004-304471; dated Dec. 8, 2009.

* cited by examiner

*Primary Examiner* — Sylvia R. MacArthur
(74) *Attorney, Agent, or Firm* — Smith, Gambrell & Russell, LLP

(57) ABSTRACT

A processing method of subjecting at least two stacked films, which comprise a first film and a second film of a target object to be processed, to a removing process by wet etching comprises bringing a first process liquid into contact with the first film of the target object, thereby etching the first film, determining whether the first film has been removed or not, switching the first process liquid to a second process liquid differing in a condition from the first process liquid when it has been determined that the first film has been removed, and bringing the second process liquid into contact with the second film, thereby etching the second film.

7 Claims, 5 Drawing Sheets

PROCESSING APPARATUS

CROSS REFERENCE TO RELATED APPLICATION

This application is a division of Ser. No. 11/252,212, filed Oct. 18, 2005 now abandoned and which is being incorporated in its entirety herein by reference.

BACKGROUND OF THE INVENTION

1. Field of the Invention

The present invention relates to a processing method and a processing apparatus for removing by a wet etching a stacked films formed of at least two films which comprise a first film and a second film of a target object to be processed such as a semiconductor wafer, and a computer program, and a computer readable storage medium.

2. Description of the Related Art

In recent years, the design rule of the semiconductor elements constituting an LSI is being made finer and finer in compliance with the demands for further improvements in the degree of integration and the operating speed of the LSI. In this connection, the gate insulating film is required to be made thinner in the MOS device.

Conventionally, a silicon oxide film or a silicon oxynitride film has been used for forming the gate insulating film. In order to obtain a desired performance by using the gate insulating film formed of the material noted above, it is necessary to form the gate insulating film very thin. However, if the gate insulating film is made thinner, the gate leak current is increased, thereby increasing the operating power.

Under the circumstances, a so-called "high-k material" such as $HfO_2$, which has a relative dielectric constant higher than that of the conventional material, attracts attentions. Such being the situation, a gate insulating film of a two-layer structure prepared by forming a high-k material film on an interfacial oxide film consisting of a very thin $SiO_2$ film has come to be used in place of the conventional gate insulating film formed of a silicon oxide film or a silicon oxynitride film.

After formation of the gate insulating film of the two-layer structure, a polysilicon film or a metal film is formed on the gate insulating film, followed by removing the excess portion of the polysilicon film or the metal film by means of a RIE etching method, thereby forming a gate electrode. It should be noted in this connection, that, after formation of the gate electrode, it is necessary to remove selectively the remaining interfacial oxide film and the high-k material film in order to expose the source region and the drain region of the silicon substrate.

In this case, it is necessary to remove selectively the interfacial oxide film ($SiO_2$ film) and the high-k material film, for example, $HfO_2$ film by means of the wet etching because a damage is done to the silicon substrate in the case of employing the RIE etching method. In the case of employing the wet etching method, however, serious problems are brought about as pointed out below.

A dilute hydrofluoric acid is used in general for removing the $SiO_2$ film by the wet etching method. However, the removing rate of the high-k material film such as a $HfO_2$ film is very low under the conditions adapted for the removal of the $SiO_2$ film to give rise to the difficulty that a long time is required for the removal of the high-k material film. In addition, $SiO_2$ exhibits an etching rate higher than that exhibited by the high-k material to give rise to an inconvenience that $SiO_2$ in the element separating region is also removed in the etching stage of the high-k material film.

In order to overcome the inconvenience pointed out above, it is conceivable to use a chemical liquid exhibiting a reverse selectivity. If the two layers noted above are removed by the etching with such a chemical liquid, however, another inconvenience is generated such that an under-cut is generated in the high-k material film because the high-k material film exhibits a high etching rate.

As pointed out above, where the two layers are removed by the wet etching, an inconvenience accompanying the etching selectivity is brought about. A technology adapted for overcoming the inconvenience pointed out above is disclosed in, for example, Japanese Patent Disclosure (Kokai) No. 2004-179583. Specifically, it is disclosed in this patent document that a wet etching is performed by using a dilute hydrofluoric acid as the chemical liquid and by defining the hydrofluoric acid concentration of the dilute hydrofluoric acid such that the two layers are etched non-selectively.

The technology disclosed in the patent document quoted above certainly permits overcoming the problems based on the etching selectivity. However, the etching conditions are not necessarily satisfactory to the two layers that are to be etched. In some cases, an inconvenience is generated such that the etching rate is rendered low.

BRIEF SUMMARY OF THE INVENTION

An object of the present invention is to provide a processing method and a processing apparatus, which do not bring about a problem in terms of the etching selectivity and which permit etching at least two stacked films of a target object to be processed at a sufficiently high etching rate in removing the two films noted above by the wet etching.

Another object of the present invention is to provide a computer program for executing the processing described above and to provide a storage medium that can be read by a computer.

According to a first aspect of the present invention, there is provided a processing method of subjecting at least two stacked films, which comprise a first film and a second film of a target object to be processed, to a removing process by wet etching, comprising bringing a first process liquid into contact with the first film of the target object, thereby etching the first film, determining whether the first film has been removed or not, switching the first process liquid to a second process liquid differing from the first process liquid in a condition when it is determined that the first film has been removed, and bringing the second process liquid into contact with the second film, thereby etching the second film.

According to a second aspect of the present invention, there is provided a processing method of subjecting at least two stacked films, which comprise a first film and a second film of a target object, to a removing process by wet etching, the method comprising Bringing a first process liquid into contact with the first film of the target object, the first process liquid being capable of etching the first film with a high etching selectivity relative to the second film, determining whether the first film has been removed or not, switching the first process liquid to a second process liquid differing from the first process liquid in a condition and capable of etching the second film with a high selectivity relative to the first film when it has been determined that the first film has been removed, and bringing the second process liquid into contact with the second film, thereby etching the second film.

According to a third aspect of the present invention, there is provided a processing apparatus for removing by a wet etching at least two stacked films, which comprise a first film and a second film of a target object to be processed, the apparatus comprising a housing section housing the target object, a first process liquid supply section for supplying the first process liquid onto the target object housed in the housing section, thereby bringing the first process liquid into contact with the first film for proceeding the etching of the first film, a second process liquid supply section for supplying the second process liquid differing in the condition from the first process liquid onto the target object housed in the housing section, thereby bringing the second process liquid into contact with the second film for proceeding the etching of the second film, a detecting section for detecting the removed state of the first film, a switching section for switching the process liquid that is brought into contact with the target object from the first process liquid to the second process liquid, and a control section for determining whether the first film has been removed on the basis of the detected value in the detecting section and, when it has been determined that the first film has been removed, for transmitting to the switching section an instruction to switch the process liquid that is brought into contact with the target object from the first process liquid to the second process liquid.

According to a fourth aspect of the present invention, there is provided a computer program including a soft ware which, when executed, causes the computer to control a processing apparatus for removing by a wet etching at least two stacked films, which comprise a first film and a second film of a target object to be processed, wherein the soft ware causes the computer to execute the operations of bringing a first process liquid into contact with the first film of the target object, thereby etching the first film, determining whether the first film has been removed or not, switching the first process liquid to a second process liquid differing in a condition from the first process liquid when it has been determined that the first film has been removed, and bringing the second process liquid into contact with the second film, thereby etching the second film.

Further, according to a fifth aspect of the present invention, there is provided a storage medium that can be read by a computer, the storage medium including a soft ware which, when executed, causes the computer to control a processing apparatus for removing by a wet etching at least two stacked films, which comprise a first film and a second film of a target object to be processed, wherein the soft ware causes the computer to execute the operations of bringing a first process liquid into contact with the first film of the target object, thereby etching the first film, determining whether the first film has been removed or not, switching the first process liquid to a second process liquid differing in a condition from the first process liquid when it has been determined that the first film has been removed, and bringing the second process liquid into contact with the second film, thereby etching the second film.

According to the present invention, at least two stacked films, which comprise a first film and a second film of the target object is removed by a wet etching. The first film is etched first with the first process liquid and, then, when it has been determined that the first film has been removed, the first process liquid is switched to the second process liquid differing in the condition from the first process liquid, thereby etching the second film with the second process liquid. It follows that, if an etchant that permits etching the first film with a high selectivity is used as the first process liquid for etching the first film, and if another etchant that permits etching the second film with a high selectivity is used as the second process liquid for etching the second film, both the first and second films can be etched with a high etching rate without giving rise to a problem in terms of the etching selectivity.

DETAILED DESCRIPTION OF THE INVENTION

Some embodiments of the present invention will now be described in detail with reference to the accompanying drawings.

Figure 1:
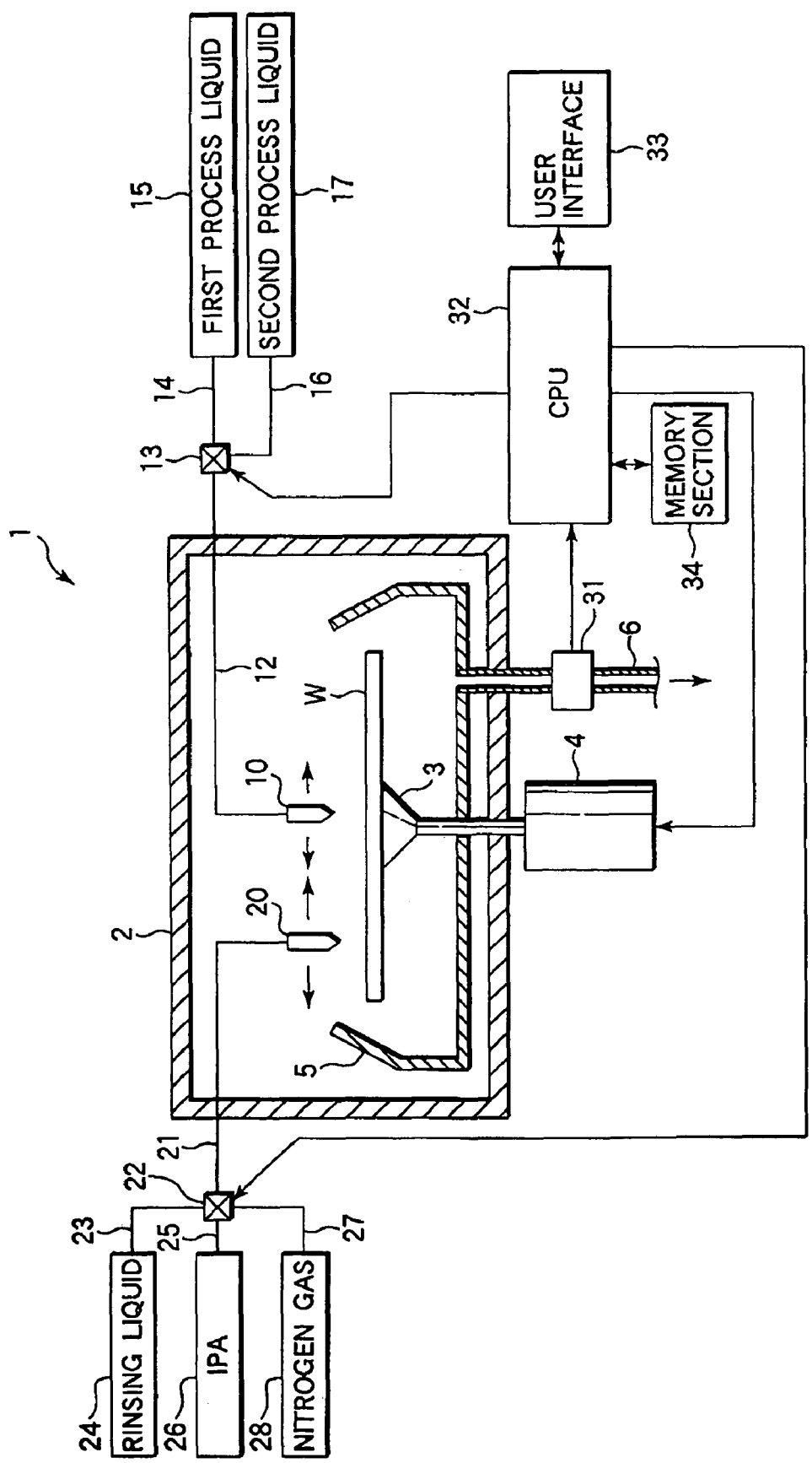
FIG. 1 is schematic diagram showing as an example the construction of a processing apparatus used for working the present invention.

FIG. 1 is schematic diagram showing as an example the construction of a processing apparatus 1 used for working the present invention. As shown in the drawing, the processing apparatus 1 comprises a chamber 2. A spin chuck 3 for horizontally holding a semiconductor wafer W that is used as a substrate by utilizing the vacuum suction is arranged within the chamber 2. The spin chuck 3 can be rotated by a motor 4. A cup 5 is arranged inside the chamber 2 in a manner to cover the wafer W held by the spin chuck 3. An exhaust/drain pipe 6 for exhausting and draining extends downward from the bottom portion of the cup 5. The pipe 6 extends downward to reach a region downward of the chamber 2.

A process liquid supply nozzle 10 is arranged above the wafer W held by the spin chuck 3. The nozzle 10 can be moved by a driving mechanism (not shown). A process liquid supply pipe 12 is connected to the process liquid supply nozzle 10, and a switching valve 13 is mounted to the process liquid supply pipe 12. A pipe 14 extending from a first process liquid supply source 15 and another pipe 16 extending from a second process liquid supply source 17 are connected to the switching valve 13. When the switching valve 13 is operated, it is possible to permit any of the first process liquid and the second process liquid to flow through the process liquid supply pipe 12 so as to be discharged from the process liquid supply nozzle 10 onto the wafer W. These first process liquid and second process liquid are supplied onto the wafer W while rotating the wafer W by driving the motor 4, thereby removing two stacked films formed on the wafer W by the wet etching as described hereinlater.

On the other hand, a cleaning/drying nozzle 20 that can be moved by a driving mechanism (not shown) is arranged above the wafer W. A pipe 21 is connected to the cleaning/drying nozzle 20, and a switching valve 22 is mounted to the pipe 21. Further, a pipe 23 extending from a rinsing liquid supply source 24, a pipe 25 extending from an IPA supply source 26 and a pipe 26 extending from a nitrogen gas supply source 28 for supplying a hot nitrogen gas are connected to the switching valve 22. When the switching valve 22 is operated, it is possible to permit any of the rinsing liquid, IPA and the nitrogen gas to flow through the pipe 21 so as to be spurted from the washing/drying nozzle 20 onto the wafer W. A rinsing liquid, e.g., a pure water, is supplied from the nozzle 20 onto the wafer W that is kept rotated by driving the motor 4, thereby cleaning the wafer W and, then, IPA is supplied onto the wafer W, followed by supplying a hot nitrogen gas onto the wafer W to dry the wafer W.

A concentration measuring apparatus 31 is mounted to the exhaust/drain pipe 6 to detect the concentration of a specified component of the drain when the first process liquid is supplied onto the wafer W for performing the wet etching. A CPU 32 is connected to the concentration measuring apparatus 31. As described hereinlater, a switching signal is transmitted from the CPU 32 to the switching valve 13 at the time when a signal, which denotes that the concentration of the component that is to be measured by the concentration measuring apparatus 31 has reached a prescribed value, is transmitted to the CPU 32. The CPU 32 also controls the operations of the entire substrate processing apparatus 1 including, for example, the operations of the switching valve 22 and the motor 4. A user interface 33 including, for example, a keyboard for performing the input operation of the command, which is performed by the process supervisor for supervising the substrate processing apparatus 1, and a display for visually showing the operating state of the substrate processing apparatus 1 is connected to the CPU 32. A memory section 34 storing a recipe recording therein the control program for realizing the various processing executed by the substrate processing apparatus 1 under the control of the CPU 32 and the process condition data is also connected to the CPU 32. An optional recipe is read from the memory section 34 in accordance with an instruction given from the user interface 33 to be executed by the CPU 32.

It is desirable to use the concentration measuring apparatus 31 that permits measuring the concentration of the component that should be measured with a high accuracy. For example, it is possible to use suitably an inductively coupled plasma mass spectroscope (ICPMS) having a detection limit of about 0.1 ppb.

The process steps that are performed for removing the two stacked films by using the processing apparatus constructed as described above will now be described with reference to the cross sectional views shown in FIGS. 2A to 2D and the flow chart shown in FIG. 3.

The following description covers the case where a gate insulating film of a two-layer structure formed on a silicon substrate and consisting of an interfacial film formed of silicon oxide ($SiO_2$) or silicon oxynitride ($SiO_xN_y$) and a high-k material film is removed by the wet etching.

Figure 2A:
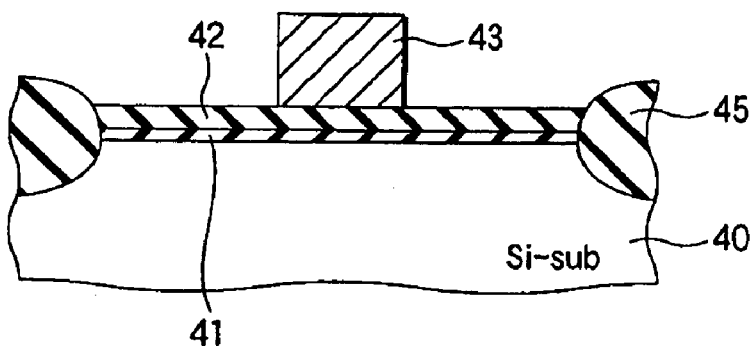
FIGS. 2A to 2D are cross sectional views for explaining the processing performed by the processing apparatus shown in FIG. 1.

In the first step, prepared is a wafer W constructed as shown in FIG. 2A as a target object that is to be subjected to the wet etching. As shown in the drawing, a very thin interfacial film 41 of silicon oxide ($SiO_2$) or silicon oxynitride ($SiO_xN_y$) is formed on the main surface of a silicon substrate 40 isolated in the shape of an island by an element separating region 45 formed of $SiO_2$. A high-k material film 42 is formed on the interfacial film 41. Further, a gate electrode 43 of polysilicon is formed on the high-k material film 42. Incidentally, a hard mask positioned above the gate electrode 43 is not shown in the drawing.

It is desirable for the high-k material film 42 to be formed of a high-k material having a relative dielectric constant not lower than 4.0 including, for example, hafnium oxide ($HfO_2$), zirconium oxide ($ZrO_2$), tantalum oxide ($Ta_2O_5$), oxides of rare earth metals, and silicates of these metals, e.g., hafnium silicate ($HfSiO_x$).

Figure 3:
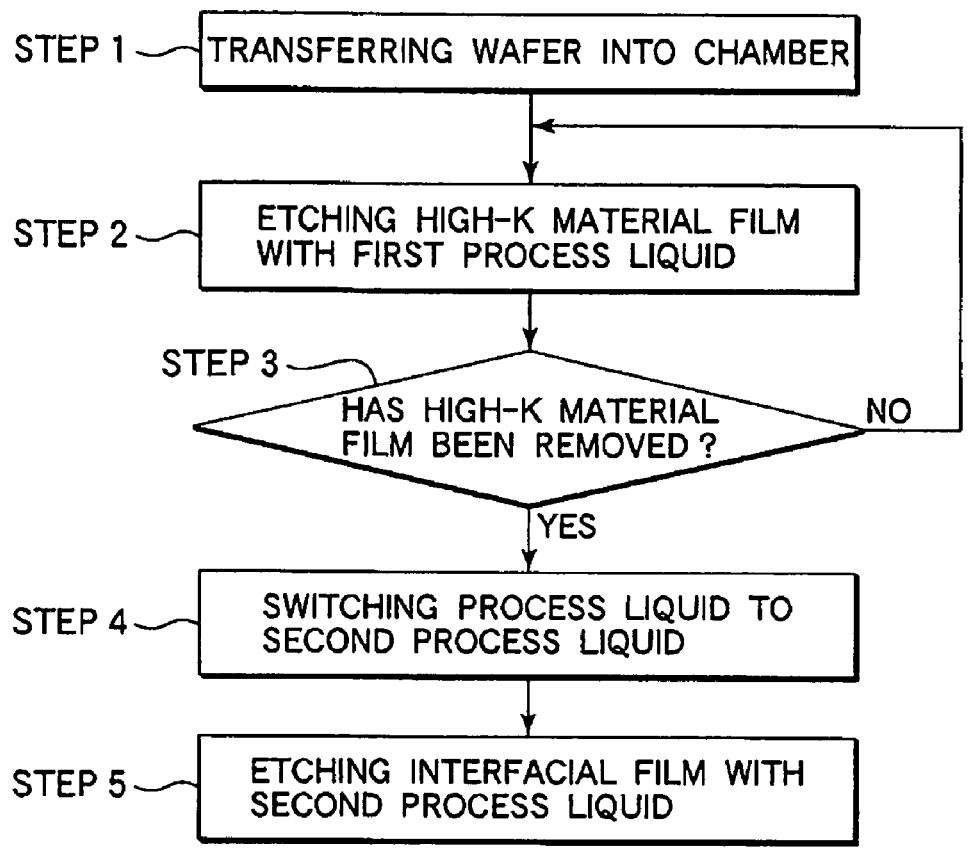
FIG. 3 is a flow chart showing the process steps performed by the processing apparatus shown in FIG. 1.

The wafer W of the construction described above is transferred into the chamber 2 of the substrate processing apparatus 1 to be disposed on the spin chuck 3 (step 1 shown in FIG. 3).

Figure 2B:
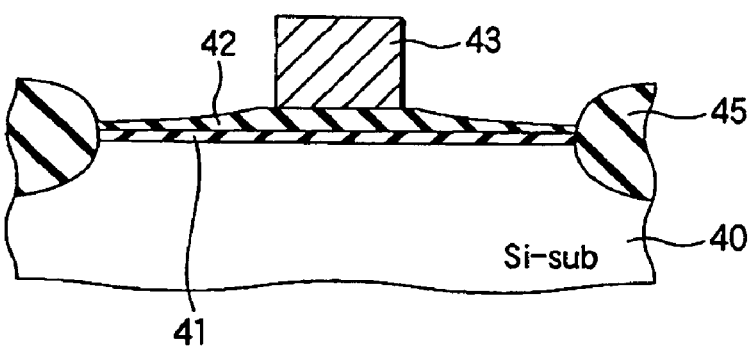

Then, the process liquid supply nozzle 10 is moved to a position immediately above the center of the wafer W and the first process liquid capable of etching the high-k material film 42 with a high selectivity relative to the interfacial film 41 is supplied from the first process liquid supply source 15 onto the wafer W through the process liquid supply nozzle 10. As a result, that portion of the high-k material film 42 which is positioned around the gate electrode 43 is selectively removed as shown in FIG. 2B (step 2 shown in FIG. 3).

Since the first process liquid is brought into contact with the high-k material film 42 included in the wafer W, thereby etching the high-k material film 42, the component of the high-k material film 42 is eluted into the first process liquid. In this case, the concentration of a prescribed component of the first process liquid discharged from the exhaust/drain pipe 6 is measured by the concentration measuring apparatus 31.

Also, the CPU 32 determines whether the high-k material film 42 has been removed or not (step 3 shown in FIG. 3). When it has been determined that the high-k material film 42 has been removed, the first process liquid is switched to the second process liquid capable of etching the interfacial film 41 with a high selectivity relative to the high-k material film 42 (step 4 shown in FIG. 3).

Figure 2C:
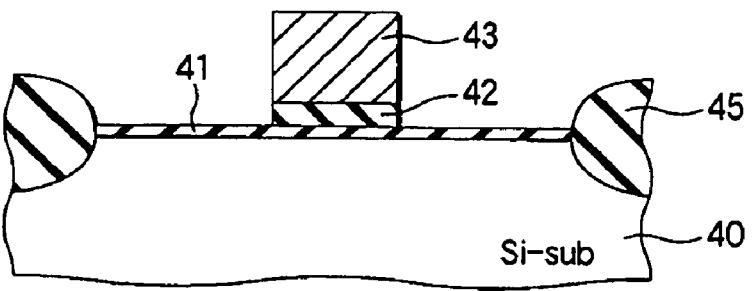

The determination noted above is performed by utilizing the measured value of the concentration of the prescribed component, i.e., the concentration obtained by the measurement performed by the concentration measuring apparatus 31. To be more specific, if the high-k material film 42 is removed, the interfacial film 41 is exposed as shown in FIG. 2C. Since the component or the amount of the component eluted into the first process liquid is changed at this stage, the CPU 32 recognizes that the change noted above is reflected by the data measured by the concentration measuring apparatus 31 so as to determine that the high-k material film 42 has been removed. As a result, a switching instruction is transmitted to the switching valve 13 so as to perform the switching from the first process liquid to the second process liquid.

To be more specific, when the high-k material film 42 is removed to expose the interfacial film 41, the amount of the component of the high-k material that is eluted into the process liquid is decreased. For example, where $HfO_2$ is used as the high-k material, the amount of Hf is decreased. By contraries, if the first process liquid permits dissolving the material of the interfacial film 41, e.g., $SiO_2$, the component of the interfacial film 41 begins to be eluted into the first process liquid. It follows that, at the time when the amount of the prescribed component of the high-k material film 42 forming the upper layer is decreased to a level lower than the set value or when the amount of the prescribed component of the interfacial film 41 forming the lower layer is increased to exceed the set value, the process liquid is switched from the first process liquid to the second process liquid on the ground that the high-k material film 42 has been removed.

Figure 2D:
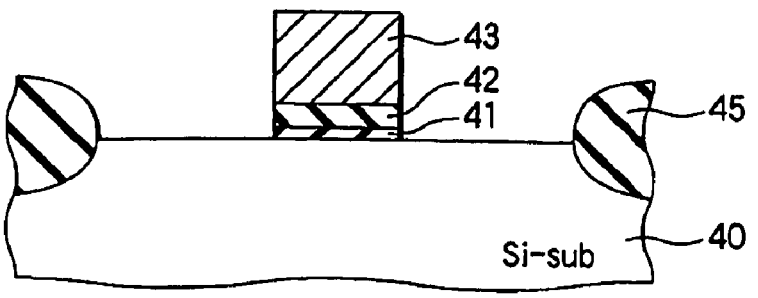

After the process liquid is switched to the second process liquid, the interfacial film 41 other than the portion positioned below the gate electrode 43 is removed by the etching with the second process liquid, as shown in FIG. 2D (step 5 shown in FIG. 3).

As described above, the first process liquid and the second process liquid differ from each other in function and, thus, in the condition as pointed out below.

First of all, the first process liquid and the second process liquid differ from each other in chemical species. It should be noted that, if an inconvenience is generated by the mixing of the first and second process liquids, it is desirable to carry out an intermediate rinsing after the processing with the first process liquid and before the processing with the second process liquid.

A second aspect to be noted is that it is also possible for the first and second process liquids to be equal to each other in the chemical species but to differ from each other in the concentration of the component and/or the pH value. For example, a dilute hydrofluoric acid that is prepared by diluting hydrofluoric acid with water is ionized within water (HF→$H^+$+$F^-$), and $F^-$ is converted into $HF_2^-$ by the reaction of (HF+$F^-$ →$HF_2^-$). In this case, $SiO_2$ is etched mainly by $HF_2^-$. On the other hand, it is known to the art that the doped oxides such as BPSG and BSG are etched directly by the HF molecules. It follows that, if the high-k material film 42 exhibits such properties as pointed out above, it is possible to remove the high-k material film 42 and the interfacial film 41 with a high etching selectivity in the case of using the first and second process liquids differing from each other in the $HF_2^-$ or HF concentration. It should also be noted that the relative concentration of the chemical species is dependent on the pH value, with the result that the high-k material film 42 and the interfacial film 41 can be removed with a high etching selectivity by using the first and second process liquids differing from each other in the pH value. As pointed out above, in the case of using the same kind of the chemical liquids, it is unnecessary to carry out the intermediate rinsing noted above. It is also possible to add a certain component of the chemical liquid to increase the concentration of the added component in place of switching the process liquid between the first process liquid and the second process liquid. For example, in the case of using an HF/alcohol type process liquid for the selective etching, the etching rate of $SiO_2$ is increased by adding water to the process liquid. In this case, the switching between the first process liquid and the second process liquid can be performed rapidly or gradually depending on the optimum condition that can be determined by experiments. Incidentally, in order to confirm whether the concentration of the constituting component of the process liquid is appropriate, it is desirable to perform the monitoring on the in-line basis.

Further, a third aspect to be noted relates to the temperature. It is possible for the first and second process liquids of the same composition to differ from each other in temperature. To be more specific, the reactivity is dependent on the temperature even if the process liquids have the same composition. It is possible for the process liquid to have a temperature adapted for the etching of $SiO_2$ and another temperature adapted for the etching of the high-k material. In this case, it is possible to etch the high-k material film 42 and the interfacial film 41 with a high etching selectivity by simply allowing the first process liquid and the second process liquid to differ from each other in temperature.

Figure 4A:
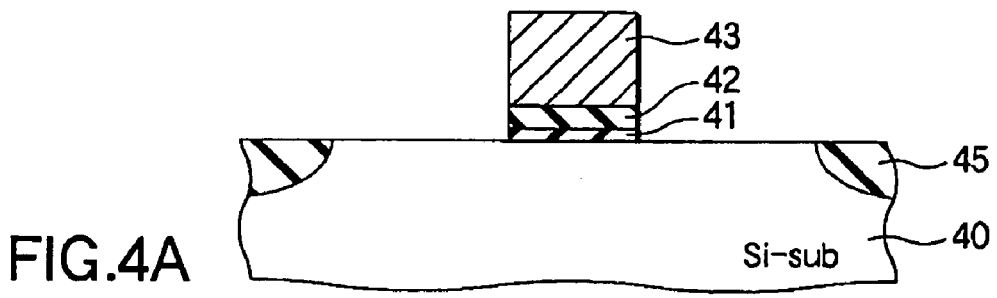
FIGS. 4A and 4B collectively show the inconveniences that are brought about in the case of employing the conventional method.
Figure 4B:
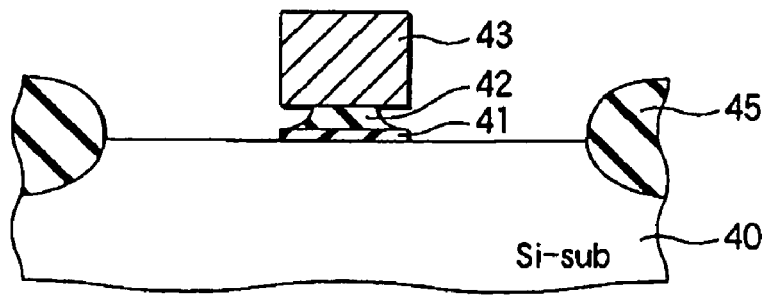

In this embodiment, the etching is performed first with the first process liquid capable of etching the high-k material film 42 with a high selectivity and, when it has been determined that the etching of the high-k material film 42 has been finished, the process liquid is switched to the second process liquid capable of etching the interfacial oxide film 41 formed of $SiO_2$ with a high etching selectivity to etch the interfacial oxide film 41. It follows that the embodiment makes it possible to overcome the problems relating to the etching selectivity such as the excessive etching of the element separating region 45 as shown in FIG. 4A and the under-cutting of the high-k material film 42 as shown in FIG. 4B. The embodiment also makes it possible to etch the high-k material film 42 and the interfacial oxide film 41 at a sufficiently high etching rate.

Figure 5:
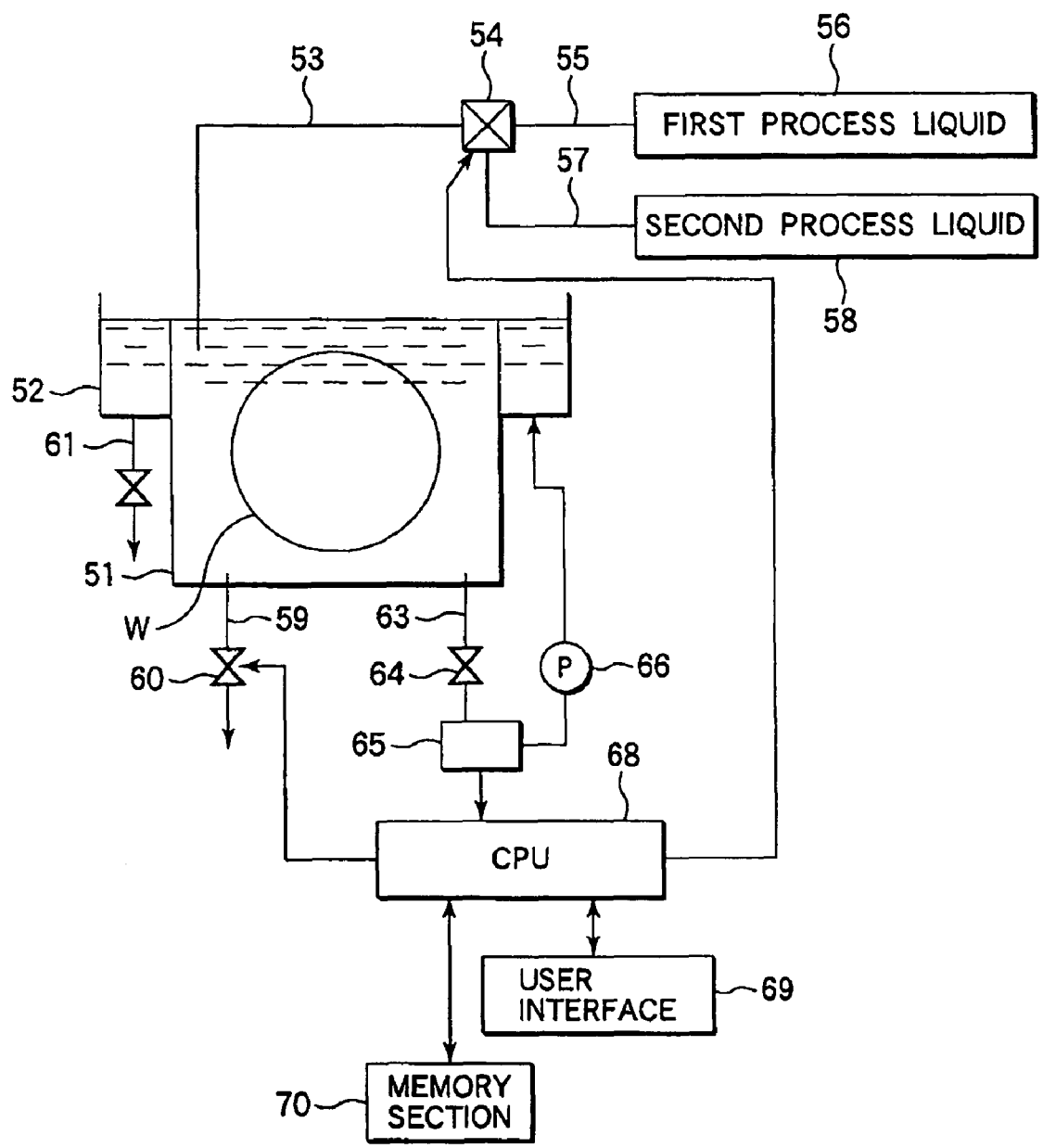
FIG. 5 is schematic diagram showing as another example the construction of a processing apparatus used for working the present invention.

Another example of the processing apparatus used for working the present invention will now be described. FIG. 5 is a schematic diagram showing another example of the construction of the processing apparatus 1' used for working the present invention.

As shown in the drawing, the processing apparatus 1' comprises a box-shaped inner vessel 51 large enough to house the wafer W and an outer vessel 52 surrounding the inner vessel 51. The wafer W is put in and taken out of the inner vessel 51 through an upper opening. It is possible for a single wafer W or a plurality of wafers W to be housed in the inner vessel 51 under the state that the wafer W is supported by a support member (not shown). A process liquid supply pipe 53 having a switching valve 54 mounted thereto is inserted into the inner vessel 51. A pipe 55 extending from a first process liquid supply source 56 and another pipe 57 extending from a second process liquid supply source 58 are connected to the switching valve 54. It is possible to supply any of the first process liquid and the second process liquid into the inner vessel 51 through the process liquid supply pipe 53 by operating the switching valve 54, with the result that the wafer W housed in the inner vessel 51 is dipped in any of the process liquids supplied into the inner vessel 51. The outer vessel 52 is mounted to surround the upper opening of the inner vessel 51 to receive the process liquid overflowing the upper edge of the inner vessel 51.

A drain line 59 having an opening-closing valve 60 mounted thereto is connected to the bottom portion of the inner vessel 51. In replacing the process liquid, the process liquid within the inner vessel 51 is discharged to the outside through the drain line 59. Also, a circulating line 61 is connected to the bottom portion of the outer vessel 52 such that the process ilquid is circulated through the circulating line 61. A reference numeral 62 denotes an opening-closing valve for opening-closing the circulating line 61.

On the other hand, a sampling line 63 is connected to the bottom portion of the inner vessel 51. An opening-closing valve 64, a concentration measuring apparatus 65 and a pump 66 are mounted to the sampling line 63, and the other edge of the sampling line 63 is connected to the bottom portion of the outer vessel 52. It follows that the sampled process liquid is circulated.

The concentration measuring apparatus 65 permits detecting the concentration of a specified component when the first process liquid is supplied into the inner vessel 51 for applying an etching to the wafer W. The concentration measuring apparatus 65 is connected to a CPU 68. As described hereinlater, a switching signal is transmitted from the CPU 68 to the switching valve 54 at the time when a signal, which indicates that the concentration of the component that is to be measured by the concentration measuring apparatus 65 has reached a prescribed value, has been transmitted to the CPU 68. The CPU 68 also controls the operations of the entire substrate processing apparatus 1'. A user interface 69 is connected to the CPU 68 as in the apparatus shown in FIG. 1. A memory section 70 storing a recipe recording therein the control program for realizing the various processings executed by the substrate processing apparatus 1' under the control of the CPU 68 and also recording therein the process condition data is also connected to the CPU 68. An optional recipe is read from the memory section 70 in accordance with the instruction given from the user interface 69 to be executed by the CPU 68.

The process steps required for removing the two stacked films by using the processing apparatus of the construction described above will now be described with reference to the cross sectional views shown in FIGS. 2A to 2D and a flow chart shown in FIG. 6. The process steps for this removing processing of the two stacked films are basically equal to those in the case of removing the two stacked films by using the apparatus 1 shown in FIG. 1 described previously.

Figure 6:
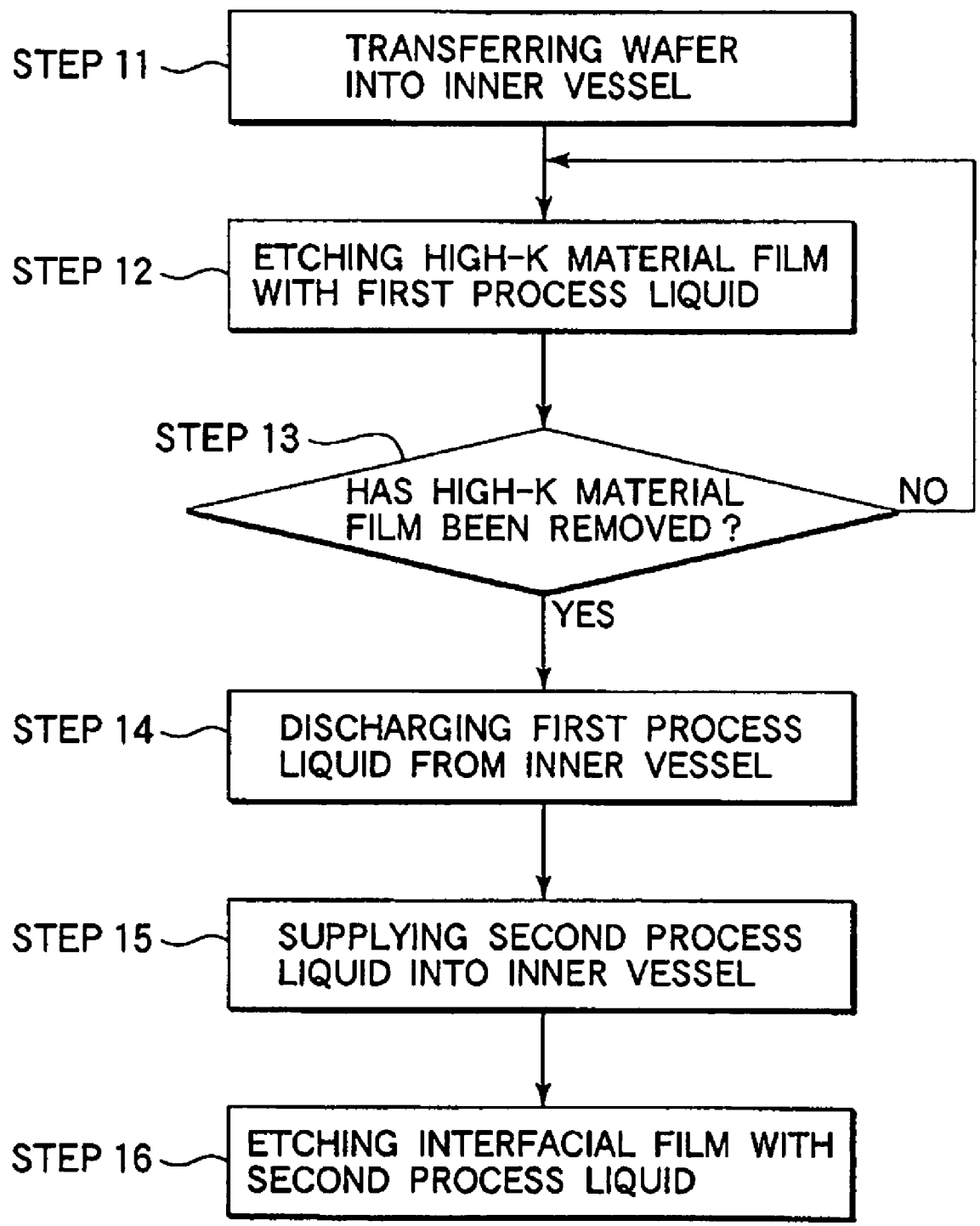
FIG. 6 is a flow chart showing the process steps performed by the apparatus shown in FIG. 5.

In the first step, prepared is a wafer W constructed as shown in FIG. 2A referred to previously as an object that is to be subjected to a wet etching and, then, the wafer W of the particular construction is inserted into the inner vessel 51 of the substrate processing apparatus 1' shown in FIG. 5 (step 11 shown in FIG. 6).

Then, the first process liquid capable of etching the high-k material film 42 with a high selectivity relative to the interfacial film 41 is supplied from the first process liquid supply source 56 into the inner vessel 51 such that the wafer W is dipped in the first process liquid, thereby etching the high-k material film 42. As a result, the high-k material film 42 around the gate electrode is selectively removed as shown in FIG. 2B (step 12 shown in FIG. 6).

Since the first process liquid is brought into contact with the high-k material film 42 of the wafer W to etch the high-k material film 42, the component of the high-k material film 42 is eluted into the first process liquid housed in the inner vessel 51, with the result that the concentration of the component of the high-k material film 42 in the first process liquid is increased. In this case, the concentration of a prescribed component in the first process liquid, which is sampled by the sampling line 63, is measured by the concentration measuring apparatus 65.

Further, the CPU 68 determines whether the high-k material film 42 has been removed or not (step 13 shown in FIG. 6) and transmits an instruction to open the opening-closing valve 60 to the opening-closing valve 60 at the time when it has been determined that the high-k material film 42 has been removed to discharge the first process liquid through the drain pipe 59 (step 14 shown in FIG. 6). Still further, the switching valve 54 is switched to permit the second process liquid capable of etching the interfacial film 41 with a high selectivity relative to the high-k material film 42 is supplied from the second process liquid supply source 58 into the inner vessel 51 through the process liquid supply pipe 53 (step 15 shown in FIG. 6).

The determination as to whether the high-k material film 42 has been removed is performed by utilizing the concentration of the prescribed component measured by the concentration measuring apparatus 65. To be more specific, the concentration of the component of the high-k material is increased in proportion to the etching time as far as the high-k material film 42 has not yet been removed completely. However, the amount of the component of the high-k material that is eluted into the first process liquid substantially ceases to be increased and the amount of the component of the interfacial film 41 is increased at the time when the interfacial film 41 has been exposed as shown in FIG. 2C. Such being the situation, the CPU 68 recognizes that the measured data of the concentration measuring apparatus 65 reflects the change in the concentration of the component of the high-k material film 42 in the first process liquid and determines that the high-k material film 42 has been removed. At the same time, the CPU 68 transmits an instruction to open to the opening-closing valve 60 and also transmits a switching instruction to the switching valve 54 so as to supply the second process liquid into the inner vessel 51.

After the second process liquid has been supplied into the inner vessel 51, the interfacial film 41 except the region positioned below the gate electrode 43 is removed by the etching with the second process liquid as shown in FIG. 2D (step 16 shown in FIG. 6).

Like previous embodiment, the etching is performed first with the first process liquid capable of etching the high-k material film 42 with a high etching selectivity and, when it has been determined that the etching of the high-k material film 42 has been finished, the process liquid is switched to the second process liquid capable of etching the interfacial oxide film 41 with a high etching selectivity to etch the interfacial oxide film 41. It follows that the embodiment makes it possible to overcome the problems relating to the etching selectivity such as the under-cutting of the high-k material film 42 and the excessive etching of the element separating region 45. The embodiment also makes it possible to etch the high-k material film 42 and the interfacial oxide film 41 at a sufficiently high etching rate.

Incidentally, in the case of the processing apparatus shown in FIG. 5, a much time is required for replacing the first process liquid with the second process liquid, with the result that the amount of the process liquid that is made useless is increased. In order to avoid this inconvenience, it is effective to store the first process liquid and the second process liquid in different vessels. In this case, the wafer W is transferred from within the vessel storing the first process liquid into the vessel storing the second process liquid at the time when it has been determined that the high-k material film 42 has been removed.

An experiment has been conducted on the etching selectivity between a $HfO_2$ film used as the high-k material film and a $SiO_2$ film used as the interfacial film.

In this experiment, used were a dilute hydrofluoric acid (DHF)/ethanol system process liquid and a dilute hydrofluoric acid (DHF) process liquid. In the former process liquid, the ethanol concentration was changed, and in the latter process liquid, the pH value of the process liquid was changed by using a pH control agent. These process liquids were brought into contact with the $HfO_2$ film and the $SiO_2$ film to measure the etching rates of these films. Incidentally, the dilute hydrofluoric acid had a concentration of 0.05 M at 25° C. Tables 1 and 2 show the etching rates of the films thus measured.

TABLE 1

| ethanol concentration in DHF/ethanol process liquid (%) | etching rate of $SiO_2$ (nm/min) | etching rate of $HfO_2$ (nm/min) |
| --- | --- | --- |
| 0 | 2.5 | 0.8 |
| 20 | 2.3 | 1.6 |
| 40 | 2.0 | 2.3 |
| 60 | 0.5 | 1.3 |
| 80 | ~0 | 0.2 |

TABLE 2

| pH value of DHF process liquid | etching rate of $SiO_2$ (nm/min) | etching rate of $HfO_2$ (nm/min) |
| --- | --- | --- |
| 0 | 0.15 | 0.3 |
| 1 | 0.2 | 0.3 |
| 2 | 0.25 | 0.3 |
| 3 | 0.25 | 0.2 |
| 3.5 | 0.2 | 0.03 |
| 4 | 0.18 | — |

Table 1 covers the case where the ethanol concentration was changed in the dilute hydrofluoric acid (DHF)/ethanol system process liquid. The experimental data support that the $SiO_2$ film can be etched with a high selectivity relative to the $HfO_2$ film in the case where the ethanol concentration is in the vicinity of 0%, and that the $HfO_2$ can be etched with a high selectivity relative to the $SiO_2$ film in the case where the ethanol concentration is increased to exceed about 60%. It should be noted, however, that, if the ethanol concentration is increased to reach 80%, the etching rate of the $HfO_2$ film is lowered, though the $HfO_2$ film can be etched with a high selectivity. Such being the situation, it is desirable for the ethanol concentration to fall within a range of 60 to 80%. Table 2 covers the case where the pH value of the dilute hydrofluoric acid (DHF) process liquid was changed. The experimental data support that the $HfO_2$ film can be etched with a high selectivity relative to the $SiO_2$ where the pH value is in the vicinity of 0. However, if the pH value is increased to 3.5 or more, the $SiO_2$ film can be etched with a high selectivity relative to the $HfO_2$ film. It has been confirmed by the experimental data that the process liquids can be combined appropriately so as to etch the $HfO_2$ film forming the high-k material film with a high etching selectivity relative to the $SiO_2$ and, then, to etch the $SiO_2$ film with a high etching selectivity relative to the $HfO_2$ film so as to remove the laminate film of the two-layer structure at a sufficiently high etching rate without giving rise to the problem relating to the etching selectivity.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

For example, the embodiment described above is directed to the case where a gate insulating film of a two-layer structure consisting of an interfacial film formed of silicon oxide ($SiO_2$) or silicon oxynitride ($SiO_xN_y$) and a high-k material film is subjected to the wet etching. However, the target object to be etched is not limited to the gate insulating film of the particular two-layer structure. It is also possible to apply the wet etching of the present invention to at least two stacked films differing from each other in the material. Also, in the embodiment described above, it has been determined whether the upper layer of the two stacked structure has been removed or not by detecting the concentration of a prescribed component in the process liquid. However, it is also possible to employ another method. For example, it is possible to determine whether the upper film has been removed or not by grasping the state of the film by using a CCD camera. Further, in the embodiment described above, the technical idea of the present invention is applied to two stacked films formed on a semiconductor wafer. However, it is also possible to apply the technical idea of the present invention to the processing of another substrate such as a glass substrate for a liquid crystal display device (LCD) and to the processing of target objects other than the substrate.

What is claimed is:

1. A processing method for performing wet etching in a processing system to process stacked films, which comprise a first film and a second film below the first film, present on a target object, the processing system comprising
a housing section configured to house the target object, a first process liquid supply section configured to supply a first process liquid into the housing section, the first process liquid being capable of etching the first film with a higher etching selectively relative to the second film,
a second process liquid supply section configured to supply a second process liquid into the housing section, the second process liquid being capable of etching the second film with a higher etching selectively relative to the first film,
a detecting section configured to measure concentration of a prescribed substance contained in liquid discharged from the housing section,
a switching section configured to switch between the first process liquid and the second process liquid to supply one of the first and second process liquids into the housing section, and
a control section configured to control a certain operation of the system,
the processing method being conducted by the control section and comprising:
performing a first etching on the target object, while supplying the first process liquid from the first process liquid supply section into the housing section that houses the target object;
detecting by the detecting section the concentration of the prescribed substance contained in the first process liquid discharged from the housing section in the first etching, the prescribed substance being a component of a least one of the first film and the second film;
performing by the control section a judgment of whether the first film has been removed, based on the amount of the component of at least one of the first film and the second film contained in the first process liquid being used for the first etching, the amount of the component being obtained from a value of the concentration thus detected by the detecting section; and
in response to a determination that the first film has been removed, switching the process liquid to be supplied into the housing section from the first process liquid to the second process liquid, and performing a second etching on the target object, while supplying the second process liquid from the second process liquid supply section into the housing section that houses the target object,
wherein the first film is a hafnium oxide film and the second film is a silicon oxide film, and the first and second process liquids respectively consist of dilute hydrofluoric acid liquids prepared by diluting hydrofluoric acid with water, which are mixed or not mixed with ethanol such that the first process liquid has a first ethanol concentration and the second process liquid has a second ethanol concentration lower than the first ethanol concentration.

2. The processing method according to claim 1, wherein the judgment of whether the first film has been removed is preset to determine that the first film has been removed at the time when the amount of a component of the first film in the first process liquid, which is detected by the detecting section, or the rate of increase in a component of the first film in the first process liquid, which is detected by the detecting section, has been made smaller or lower that the set value.

3. The processing method according to claim 1, wherein the judgment of whether the first film has been removed is preset to determine that the first film has been removed at the time when the amount of a component of the second film in the first process liquid, which is detected by the detecting section, or the rate of increase in a component of the second film in the first process liquid, which is detected by the detecting section, has been made larger or higher that the set value.

4. The processing method according to claim 1, wherein the first process liquid supply section and the second process liquid supply section supply the first process liquid and the second process liquid, respectively, onto the surface of the target object.

5. The processing method according to claim 1, wherein the first process liquid supply section and the second process liquid supply section supply the first process liquid and the second process liquid, respectively, into the housing section such that the target object housed in the housing section is dipped in the first process liquid and the second process liquid, respectively.

6. The processing method according to claim 1, wherein the dilute hydrofluoric acid liquids of the first and second process liquids have the same hydrofluoric acid concentration prepared by diluting hydrofluoric acid with water.

7. The processing method according to claim 6, wherein the first ethanol concentration is 60 to 80%, and the second ethanol concentration is 0 to 40%.

* * * * *